United States Patent
Richter et al.

(10) Patent No.: US 9,590,151 B2
(45) Date of Patent: Mar. 7, 2017

(54) METHOD FOR PRODUCING A PLURALITY OF RADIATION-EMITTING SEMICONDUCTOR CHIPS

(71) Applicant: OSRAM Opto Semiconductors GmbH, Regensburg (DE)

(72) Inventors: Markus Richter, Burglengenfeld (DE); Alexander Baumgartner, Donaustauf (DE); Hans-Christoph Gallmeier, Regensburg (DE); Tony Albrecht, Bad Abbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/785,620

(22) PCT Filed: Apr. 14, 2014

(86) PCT No.: PCT/EP2014/057528
§ 371 (c)(1),
(2) Date: Oct. 19, 2015

(87) PCT Pub. No.: WO2014/170271
PCT Pub. Date: Oct. 23, 2014

(65) Prior Publication Data
US 2016/0079489 A1 Mar. 17, 2016

(30) Foreign Application Priority Data
Apr. 19, 2013 (DE) .................. 10 2013 103 983

(51) Int. Cl.
H01L 33/50 (2010.01)
H01L 33/00 (2010.01)
(Continued)

(52) U.S. Cl.
CPC ........ *H01L 33/507* (2013.01); *H01L 33/0095* (2013.01); *H01L 33/508* (2013.01);
(Continued)

(58) Field of Classification Search
CPC .............................. H01L 33/50; H01L 33/507
See application file for complete search history.

(56) References Cited

U.S. PATENT DOCUMENTS 8,841,146 B2 * 9/2014 Yen ..................... H01L 33/0095
257/E21.528
2009/0236627 A1 9/2009 Kim et al.
(Continued)

FOREIGN PATENT DOCUMENTS

DE 102009018087 A1 12/2009
DE 102010028407 A1 11/2011
(Continued)

*Primary Examiner* — Yu-Hsi D Sun
(74) *Attorney, Agent, or Firm* — McDermott Will & Emery LLP

(57) ABSTRACT

A method is provided for producing a plurality of radiation-emitting semiconductor chips, having the following steps:
providing a plurality of semiconductor bodies (1) which are suitable for emitting electromagnetic radiation from a radiation exit face (3),
applying the semiconductor bodies (1) to a carrier (2),
applying a first mask layer (4) to regions of the carrier (2) between the semiconductor bodies (1),
applying a conversion layer (5) to the entire surface of the semiconductor bodies (1) and the first mask layer (4) using a spray coating method, and
removing the first mask layer (4), such that in each case a conversion layer (5) arises on the radiation exit faces (3) of the semiconductor bodies (1).

15 Claims, 2 Drawing Sheets

(51) Int. Cl.
*H01L 33/54* (2010.01)
*H01L 33/56* (2010.01)
*H01L 33/60* (2010.01)

(52) U.S. Cl.
CPC .............. *H01L 33/54* (2013.01); *H01L 33/56* (2013.01); *H01L 33/60* (2013.01); *H01L 2933/005* (2013.01); *H01L 2933/0041* (2013.01); *H01L 2933/0058* (2013.01)

(56) References Cited

U.S. PATENT DOCUMENTS

| | | |
|---|---|---|
| 2011/0220920 A1 | 9/2011 | Collins et al. |
| 2012/0244652 A1* | 9/2012 | Chen ................... H01L 33/505 438/27 |
| 2012/0299019 A1 | 11/2012 | Lin et al. |

FOREIGN PATENT DOCUMENTS

| | | |
|---|---|---|
| DE | 102012208900 A1 | 11/2013 |
| EP | 1993151 A2 | 11/2008 |
| EP | 2685512 A1 | 1/2014 |
| WO | 2005/100016 A2 | 10/2005 |
| WO | 2012/090961 A1 | 7/2012 |
| WO | 2012/124426 A1 | 9/2012 |

* cited by examiner

METHOD FOR PRODUCING A PLURALITY OF RADIATION-EMITTING SEMICONDUCTOR CHIPS

A method is provided for producing a plurality of radiation-emitting semiconductor chips.

A radiation-emitting semiconductor chip is described for example in document DE 10 2010 028 407.

The object of the present invention is to provide a method for producing a plurality of radiation-emitting semiconductor chips which in particular enables an inexpensive and efficient method for applying a conversion layer at wafer level.

This object is achieved by a method having the steps of claim 1. Advantageous embodiments and further developments of the method are indicated in the dependent claims.

In the method a plurality of semiconductor bodies are provided which are suitable for emitting electromagnetic radiation from a radiation exit face.

According to one embodiment of the method, the semiconductor bodies are applied to a carrier. The semiconductor bodies are preferably applied spacedly to the carrier, such that freely accessible regions of the carrier arise between the semiconductor bodies.

A first mask layer is applied to the freely accessible regions of the carrier between the semiconductor bodies. The first mask layer is intended to prevent deposition of a subsequently applied conversion layer directly onto the regions of the carrier between the semiconductor bodies.

The first mask layer preferably comprises individual first mask pattern elements, wherein each first mask pattern element particularly preferably as far as possible completely covers a region of the carrier between two directly adjacent semiconductor bodies. Particularly preferably, each first mask pattern element in each case adjoins the side faces of the adjacent semiconductor bodies.

It is alternatively also possible for the mask pattern elements of the first mask layer to be arranged spaced from the adjacent semiconductor bodies, for example, in order not to damage a bonding wire which electrically contacts the respective semiconductor body. It is moreover also possible, with the assistance of first mask pattern elements, which are arranged at a given distance from the adjacent semiconductor bodies, to achieve coating of the side flanks of the semiconductor bodies in a subsequent spray coating method. Coating of the side flanks of the semiconductor bodies, for instance with a conversion layer, is in particular desirable if the semiconductor body emits electromagnetic radiation via the side flanks when in operation. This is the case, for example, for a semiconductor body of flip chip construction.

According to a further embodiment of the method, a conversion layer is applied to the semiconductor bodies and the first mask layer, particularly preferably over the full surface thereof, using a spray coating method. The conversion layer in this case covers the surface formed by the semiconductor bodies and the first mask pattern elements as far as possible completely. The conversion layer is here preferably applied in direct contact with the surface formed by the semiconductor bodies and the first mask pattern elements.

The surface formed by the semiconductor bodies and the first mask pattern elements may in this case have a topography. In other words, the surface formed by the semiconductor bodies and the first mask pattern elements may have projections and recesses, which arise for example as a result of different thicknesses of the semiconductor bodies and the first mask pattern elements.

If a layer is applied using a spray coating method to a surface with a topography, the layer may replicate the topography. If the surface to which the conversion layer is applied thus has a topography, the conversion layer may replicate this topography.

When in operation, the semiconductor bodies emit electromagnetic radiation of a first wavelength range from their radiation exit faces. The conversion layer is intended to convert the electromagnetic radiation of the first wavelength range into radiation of a second wavelength range which differs from the first wavelength range. In other words, the conversion layer is configured to convert wavelengths.

The phrase "to convert wavelengths" is here in particular intended to mean that irradiated electromagnetic radiation of a given wavelength range is converted into electromagnetic radiation of another, preferably longer-wave, wavelength range. As a rule, a wavelength-converting element absorbs electromagnetic radiation of an irradiated wavelength range, converts it by electronic processes at atomic and/or molecular level into electromagnetic radiation of another wavelength range and re-emits the converted electromagnetic radiation.

According to one embodiment of the method, the first mask layer is removed, such that in each case a conversion layer arises at least on the radiation exit face of the semiconductor bodies. The regions of the carrier which were covered by the pattern elements of the first mask layer are in this case particularly preferably free of the conversion layer. The conversion layer material removed with the first mask layer may advantageously be collected and recycled.

According to one embodiment of the method, the first mask layer projects above the semiconductor bodies. For example, the first mask layer projects above the semiconductor bodies by a protruding distance of a height of between 30 micrometers and 200 micrometers inclusive. For example, the protruding distance has a value of around 100 micrometers.

According to a further embodiment of the method, the conversion layer comprises an organic potting material into which particles of an inorganic luminescent material have been introduced. The luminescent material imparts the wavelength-converting characteristics to the conversion layer.

One of the following materials is for example suitable as the inorganic luminescent material: rare earth metal-doped garnets, rare earth metal-doped alkaline earth metal sulfides, rare earth metal-doped thiogallates, rare earth metal-doped aluminates, rare earth metal-doped silicates, rare earth metal-doped orthosilicates, rare earth metal-doped chlorosilicates, rare earth metal-doped alkaline earth silicon nitrides, rare earth metal-doped oxynitrides, rare earth metal-doped aluminium oxynitrides, rare earth metal-doped silicon nitrides or rare earth metal-doped sialons.

The organic potting material may for example be an epoxide or a silicone, such as a polysilazane.

The spray coating method for applying the conversion layer comprises for example the following steps:
 providing a suspension of the luminescent material particles, the organic potting material and an organic solvent, and
 spraying the suspension onto the surface to be coated.

The suspension is generally sprayed on over the entire surface to be coated.

With the assistance of the organic solvent it is possible in this embodiment of the method advantageously to reduce the viscosity of the suspension to be sprayed on. One of the following materials is for example suitable as organic solvent: an alkane, toluene or xylene.

The organic solvent generally evaporates after completion of the conversion layer. Evaporation of the organic solvent may for example also be accelerated by a drying process. Particularly preferably, the conversion layer of a finished semiconductor chip is advantageously very largely free of the organic solvent. It is however wholly conceivable that very low residues of the organic solvent remain in the conversion layer and wholly complete removal of the solvent from the conversion layer is impossible for technical reasons.

The luminescent material particles particularly preferably have a concentration of between 10% by weight and 45% by weight inclusive in the suspension. For example, the suspension is in each case composed of one third luminescent material particles, one third organic solvent and one third organic potting material, the proportions being based on weight.

The diameter of the luminescent material particles particularly preferably has a median $d_{50}$ of at most 35 micrometers. The luminescent material particles for example have a median $d_{50}$ of roughly 16 micrometers. The median is here the number in the middle of a plurality of values if the values are sorted by magnitude. The median thus divides a number of values or a distribution into two halves, such that the values in the one half are lower than the median value and greater in the other half.

For reasons of conversion layer conversion efficiency, a layer with large luminescent material particles is particularly desirable. However, the size of the luminescent material particles is defined by the spray coating method, since the larger the luminescent material particles, the more difficult it generally is to spray on a suspension.

For example, the conversion layer has a thickness of between 5 micrometers and 80 micrometers inclusive. For example, the conversion layer has a thickness of 35 micrometers.

According to one embodiment of the method, the spray coating method for applying the conversion layer comprises a plurality of successive spraying steps, wherein in each spraying step an individual conversion layer is produced. Particularly preferably, the individual conversion layers are dried between the individual spraying steps, for example with the assistance of a circulating air oven.

As a rule, the individual conversion layer is a very thin layer, the thickness of which is determined by the grain size of the individual luminescent material particles. As a rule, in this case with each spraying step an individual conversion layer is deposited, which preferably has just one monolayer of luminescent material particles. In the subsequent spraying steps for depositing further individual conversion layers, the luminescent material particles sprayed on in each case are particularly preferably arranged in the gaps that have arisen in the underlying individual conversion layer between the luminescent material particles thereof. In this way, a conversion layer with a particularly high packing density is produced.

According to a further embodiment of the method, after removal of the first mask layer an adhesion-promoting layer is applied over the entire surface of the carrier with the semiconductor bodies. The adhesion-promoting layer is particularly preferably likewise deposited by means of a spray coating method. The adhesion-promoting layer may, like the conversion layer, be produced by spraying on a plurality of individual adhesion-promoting layers. The individual adhesion-promoting layers may be dried between the individual spraying steps.

The adhesion-promoting layer particularly preferably covers the exposed regions of the carrier between the semiconductor bodies, the side faces of the semiconductor bodies and the conversion layer on the semiconductor bodies as well as a major face of the conversion layer remote from the radiation exit faces of the semiconductor bodies. The adhesion-promoting layer is for example arranged in direct contact with the exposed regions of the carrier between the semiconductor bodies, the side faces of the semiconductor bodies and the conversion layer as well as a major face of the conversion layer remote from the radiation exit faces of the semiconductor bodies.

The adhesion-promoting layer is provided in particular to improve adhesion to a subsequently applied reflective layer. The thickness of the adhesion-promoting layer is particularly preferably between 1 micrometer and 5 micrometers inclusive.

One of the following materials may for example be present in the adhesion-promoting layer as adhesion promoter: silane or siloxane.

The adhesion-promoting layer may also consist of one of these materials.

Particularly preferably, the spray coating method for applying the adhesion-promoting layer comprises the following steps:
providing a mixture of the adhesion promoter and an organic solvent, and
spraying the mixture onto the surface to be coated.

The materials already listed above are again suitable as organic solvent.

According to a further embodiment of the method, a reflective layer is applied over the entire surface of the semiconductor bodies, as a rule onto the conversion layer or onto the adhesion-promoting layer. In the subsequent semiconductor chips a reflective layer is here in each case arranged in the beam path of the semiconductor bodies. The reflective layer is preferably likewise applied using a spray coating method. The reflective layer in the beam path of the semiconductor bodies may have a positive influence on the brightness of the subsequent semiconductor chips. In this embodiment, the thickness of the reflective layer, at least over the semiconductor bodies, particularly preferably does not exceed a value of 25 micrometers.

According to a further embodiment of the method, a second mask layer is applied to the conversion layers on the radiation exit faces of the semiconductor bodies. The second mask layer here comprises second mask pattern elements. Each second mask pattern element preferably completely covers a conversion layer of a semiconductor body, while the regions between the semiconductor bodies are free of the mask layer. In a next step, a reflective layer is applied over the entire surface of the second mask layer and onto the regions between the semiconductor bodies. Application of the reflective layer particularly preferably likewise proceeds using a spray coating method.

Finally, the second mask layer is removed, such that the regions of the carrier between the semiconductor bodies are covered with a reflective layer. In this embodiment, the conversion layers are particularly preferably free of the reflective layer.

The reflective layer here preferably extends between the semiconductor bodies as far as the major face of the conversion layer remote from the radiation exit face of the semiconductor body. Particularly preferably, the reflective layer between the semiconductor bodies terminates flush with the major face of the conversion layer remote from the radiation exit face of the semiconductor body.

Particularly preferably, the reflective layer is used in conjunction with an adhesion-promoting layer, wherein the adhesion-promoting layer is provided to improve adhesion to the reflective layer within the subsequent semiconductor chip. Particularly preferably, the reflective layer is therefore arranged in direct contact with the adhesion-promoting layer.

The reflective layer is therefore for example arranged in direct contact with the adhesion-promoting layer on the regions of the carrier between the semiconductor bodies, with the side faces of the semiconductor bodies and with the side faces of the conversion layer. As a rule, the reflective layer is also in direct contact with the pattern elements of the second mask layer.

The reflective layer preferably comprises reflective particles which have been introduced into an organic potting material. The reflective particles impart the reflective characteristics to the reflective layer. One of the potting materials already mentioned above may for example be used as the organic potting material. The reflective particles for example comprise one of the following materials or consist of one of the following materials: titanium oxide, aluminium oxide or silicon oxide.

According to one embodiment of the method, the spray coating method for applying the reflective layer comprises the following steps:

providing a suspension of reflective particles, an organic potting material and an organic solvent, and spraying the suspension onto the surface to be coated.

Here too, the organic solvent is provided to adjust the viscosity of the suspension to be sprayed on.

The reflective layer may also, like the conversion layer, be deposited in a plurality of successive spraying steps, in which in each case an individual reflective layer is produced. If the reflective layer comprises reflective particle in a potting material, deposition of the individual reflective layers may proceed in a manner similar to deposition of the individual conversion layers with luminescent material particles.

The reflective layer preferably has a thickness of between 5 micrometers and 30 micrometers inclusive.

One of the following devices may for example be used as first mask layer and/or second mask layer: a patterned photoresist layer, a stencil or a prepatterned film. The stencil may be a metal stencil or a plastics stencil.

The present method makes use of the concept of applying specific layers included in a radiation-emitting semiconductor chip, such as the conversion layer, the adhesion-promoting layers or the reflective layers, by means of a spray coating method. Use of a spray coating method in particular allows for particularly simple and inexpensive production.

A spray coating method alone is in particular suitable for providing macroscopic areas, for example of the size of a wafer, with a layer over their entire surface. In the present case, however, it is for example desired merely to provide the radiation exit faces of the semiconductor bodies with a conversion layer, such that patterned application, for instance of the conversion layer, is necessary. To this end, the use of masks is here proposed. With patterned application of a conversion layer, the emission pattern of the subsequent semiconductor chips may moreover be influenced in the desired manner. By combining a spray coating method with a mask technology, it is advantageously possible to achieve particularly efficient and inexpensive production of radiation-emitting semiconductor bodies with a conversion layer.

Figure 1:
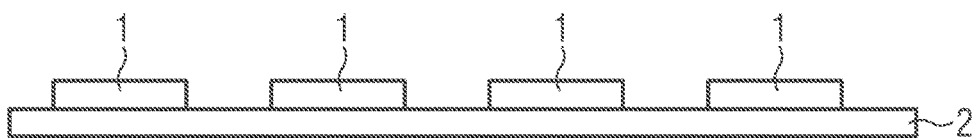
FIG. 1 illustrates an example embodiment in which a plurality of semiconductor bodies is applied to a carrier.

Further advantageous embodiments and further developments of the invention are revealed by the exemplary embodiments described below in connection with the figures.

A method according to a first exemplary embodiment is described with reference to the schematic sectional representations of FIGS. 1 to 4.

A further exemplary embodiment of the method is described with reference to the schematic sectional representations of FIGS. 5 to 8.

Identical, similar or identically acting elements are provided with the same reference numerals in the figures. The figures and the size ratios of the elements illustrated in the figures relative to one another are not to be regarded as being to scale. Rather, individual elements, in particular layer thicknesses, may be illustrated on an exaggeratedly large scale for greater ease of depiction and/or better comprehension.

In the method according to the exemplary embodiment of FIGS. 1 to 4, in a first step a plurality of semiconductor bodies 1 is applied to a carrier 2 (FIG. 1). The semiconductor bodies 1 are suitable for emitting electromagnetic radiation of a first wavelength range from their radiation exit faces 3. In the present case, the semiconductor bodies 1 are arranged spaced from one another on the carrier 2, such that exposed regions of the carrier 2 arise between the semiconductor bodies 1.

Figure 2:
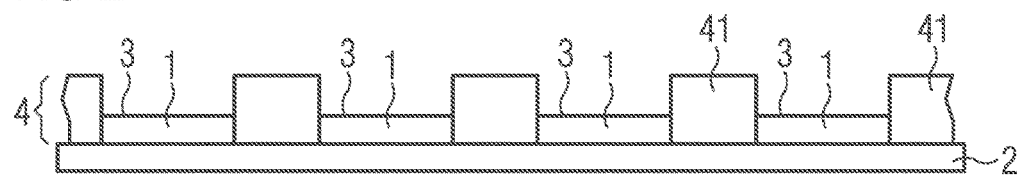
FIG. 2 illustrates an example embodiment in which first mask pattern elements of a first mask layer are applied between the semiconductor bodies.

As is illustrated schematically in FIG. 2, first mask pattern elements 41 of a first mask layer 4 are applied between the semiconductor bodies 1. The mask pattern elements 41 completely fill the previously exposed regions of the carrier 2 between the semiconductor bodies 1. Furthermore, the first mask layer 4 projects above the semiconductor bodies 1 by a protruding distance.

Figure 3:
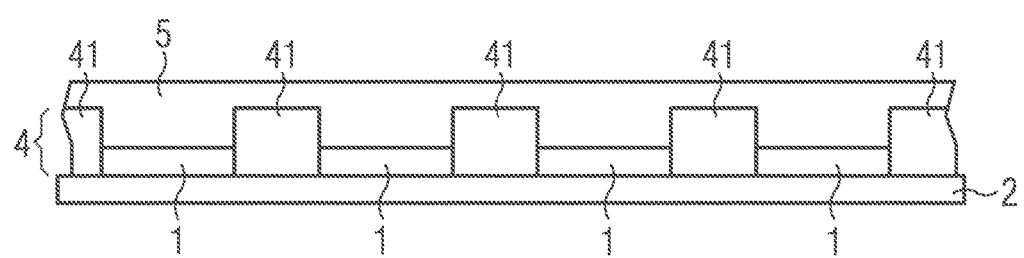
FIG. 3 illustrates an example embodiment in which a conversion layer is applied over the surface of the semiconductor bodies and the first mask layer.

In a next step, a conversion layer 5 is applied over the entire surface of the semiconductor bodies 1 and the first mask layer 4 by means of a spray coating method. The conversion layer 5 here completely covers the semiconductor bodies 1 and the pattern elements 41 of the first mask layer 4, so producing a continuous conversion layer 5 surface (FIG. 3).

When applying the conversion layer 5 with a spray coating method, it is possible for individual layers of the conversion layer 5 to be applied in separate spraying steps and dried in between (not shown).

Figure 4:
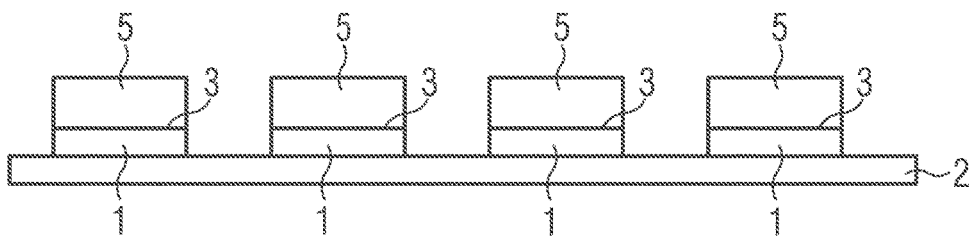
FIG. 4 illustrates an example embodiment in which the first mask layer is removed.
Figure 5:
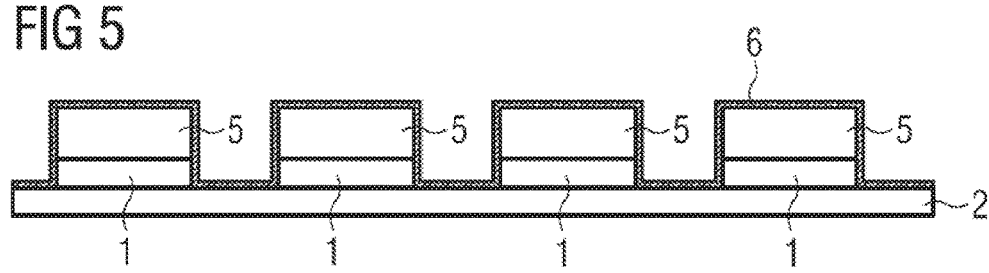
FIG. 5 illustrates an example embodiment in which an adhesion-promoting layer is applied over the surface of the semiconductor bodies with the conversion layer on the carrier.

In a next step, which is illustrated schematically in FIG. 4, the first mask layer 4 is removed. In this way, semiconductor bodies 1 arise which are arranged spaced from one another on the carrier 2 and in each case have a conversion layer 5 on their radiation exit faces 3. The conversion layer 5 here has the dimensions of the radiation exit faces 3 of the semiconductor bodies 1, while the regions of the carrier 2 between the semiconductor bodies 1 are free of the conversion layer 5.

In the method according to the exemplary embodiment of FIGS. 5 to 8, firstly the steps are carried out as already described with reference to FIGS. 1 to 4.

Then an adhesion-promoting layer 6 is applied over the entire surface of the semiconductor bodies 1 with the conversion layer 5 on the carrier 2, likewise by a spray coating method. The exposed regions of the carrier 2 between the semiconductor bodies 1 are in this case completely covered with the adhesion-promoting layer 6, likewise the side flanks of the semiconductor bodies 1 and the conversion layers 5 as well as the major faces of the conversion layers 5 in each case remote from the radiation exit face 3 of the semiconductor body 1. In this case, the topography of the underlying surface, which is formed by the semiconductor bodies 1 with the conversion layer 5, is replicated in the adhesion-promoting layer 6.

Figure 6:
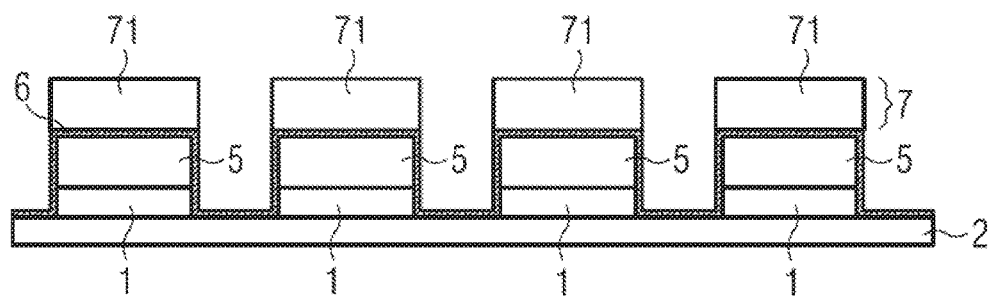
FIG. 6 illustrates an example embodiment in which a second mask layer is applied to the semiconductor bodies.

In a further step, which is illustrated schematically in FIG. 6, a second mask layer 7 is applied to the semiconductor bodies. In this case, second pattern elements 71 of the second mask layer 7 completely cover the conversion layer 5, while the regions between the semiconductor bodies 1 with the conversion layer 5 are free of the second pattern elements 71 of the second mask layer 7.

Figure 7:
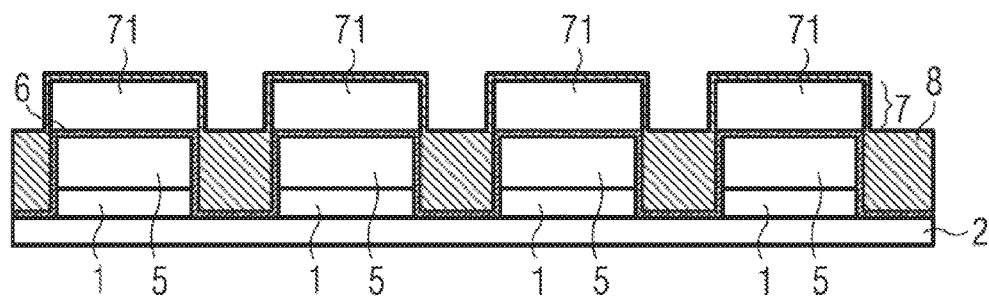
FIG. 7 illustrates an example embodiment in which a reflective layer is applied and fills the regions between the semiconductor bodies.

Then a reflective layer 8 is applied, likewise by a spray coating method. The material of the reflective layer 8 here in each case completely fills the regions between the semiconductor bodies 1. The reflective layer 8 in each case terminates flush with the major face of the conversion layer 5 remote from the radiation exit face 3 of the semiconductor body 1. The side faces of the second pattern element 71 of the second mask layer 7 and the major face of the second mask pattern elements 71 remote from the carrier 2 are likewise completely covered by the reflective layer 8 (FIG. 7).

Figure 8:
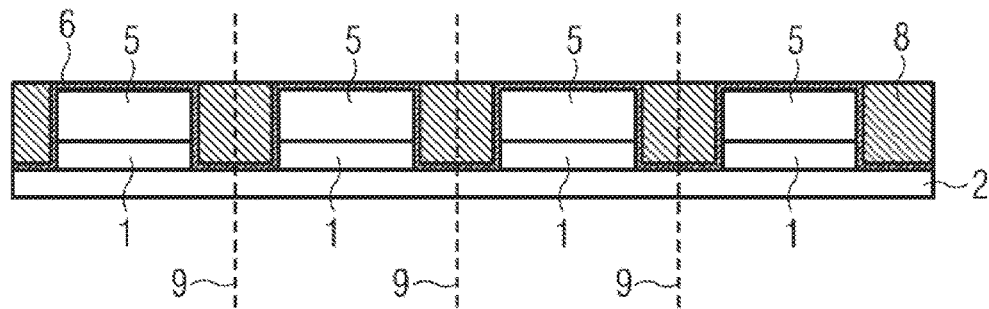
FIG. 8 illustrates an example embodiment in which the second mask layer is removed.

In a next step the second mask layer 7 is removed. A plurality of semiconductor bodies 1 arises which are applied to a carrier 2 and on the radiation exit faces 3 of which a conversion layer 5 is in each case arranged in direct contact. The conversion layer 5 here terminates in the vertical direction laterally completely with the semiconductor body 1. An adhesion-promoting layer 6 is applied uniformly over the entire face of the conversion layer 5 remote from the radiation exit face 3 of the semiconductor body 1, the side flanks of the conversion layer 5 and the semiconductor bodies 1 as well as the regions of the carrier 2 arranged between the semiconductor bodies 1. The adhesion-promoting layer 6 is provided to improve adhesion to the reflective layer 8. The regions between the semiconductor bodies 1 are finally filled completely with the reflective layer 8 as far as the major face of the conversion layer 5 remote from the radiation exit face 3 of the semiconductor body 1. The semiconductor chips present in the wafer assembly may then be singulated along dividing lines 9 (FIG. 8).

In the method according to the exemplary embodiment of FIGS. 5 to 8 it is moreover also possible to dispense with the second mask layer 7 and to apply the reflective layer 8 over the entire surface of the adhesion-promoting layer 6. In this case, the reflective layer 8 is in particular in each case positioned over the radiation exit faces 3 of the semiconductor bodies 1, such that in each case a reflective layer 8 (not shown) is located in the beam paths of the semiconductor bodies 1.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

This patent application claims priority from German patent application 102013103983.9, the disclosure content of which is hereby included by reference.

The invention claimed is:

1. A method for producing a plurality of radiation-emitting semiconductor chips having the following steps:
   providing a plurality of semiconductor bodies which are suitable for emitting electromagnetic radiation from a radiation exit face;
   applying the semiconductor bodies to a carrier;
   applying a first mask layer to regions of the carrier between the semiconductor bodies;
   applying a conversion layer to the entire surface of the semiconductor bodies and the first mask layer using a spray coating method;
   removing the first mask layer, such that in each case a conversion layer arises on the radiation exit faces of the semiconductor bodies;
   applying a second mask layer to the conversion layer, which in each case completely covers the conversion layer and leaves the regions between the semiconductor bodies free;
   applying a reflective layer over the entire surface of the second mask layer and the regions between the semiconductor bodies using a spray coating method; and
   removing the second mask layer, such that the regions between the semiconductor bodies are covered with a reflective layer.

2. The method according to claim 1, in which the first mask layer projects above the semiconductor bodies.

3. The method according to claim 1, in which the conversion layer comprises an organic potting material, into which particles of an inorganic luminescent material have been introduced.

4. The method according to claim 3, in which the spray coating method for applying the conversion layer (5) comprises the following steps:
   providing a suspension of the luminescent material particles, the organic potting material and an organic solvent; and
   spraying the suspension onto the surface to be coated.

5. The method according to claim 4, in which the luminescent material particles have a concentration of between 10% by weight and 45% by weight inclusive in the suspension.

6. The method according to claim 1, in which the diameter of the luminescent material particles has a median $d_{50}$ of at most 35 micrometers.

7. The method according to claim 1, in which the conversion layer has a thickness of between 5 micrometers and 80 micrometers inclusive.

8. The method according to one claim 1, in which the spray coating method for applying the conversion layer comprises a plurality of successive spraying steps, wherein in each spraying step an individual conversion layer is produced.

9. The method according to claim 8, in which the individual conversion layers are dried between the individual spraying steps.

10. The method according to claim 1, in which the reflective layer comprises reflective particles, which have been introduced into an organic potting material.

11. The method according to claim 1, in which the spray coating method for applying the reflective layer comprises the following steps:
providing a suspension of reflective particles, an organic potting material and an organic solvent; and
spraying the suspension onto the surface to be coated.

12. The method according to claim 1, in which the reflective layer has a thickness of between 5 micrometers and 30 micrometers inclusive.

13. The method according to claim 1, in which one of the following devices is used as first mask layer and/or second mask layer: a patterned photoresist layer, a stencil or a prepatterned film.

14. A method for producing a plurality of radiation-emitting semiconductor chips having the following steps:
providing a plurality of semiconductor bodies which are suitable for emitting electromagnetic radiation from a radiation exit face;
applying the semiconductor bodies to a carrier;
applying a first mask layer to regions of the carrier between the semiconductor bodies;
applying a conversion layer to the entire surface of the semiconductor bodies and the first mask layer using a spray coating method;
removing the first mask layer, such that in each case a conversion layer arises on the radiation exit faces of the semiconductor bodies; and
applying an adhesion promoting layer over the entire surface of the carrier with the semiconductor bodies, wherein in each case a conversion layer is arranged on the radiation exit face.

15. A method for producing a plurality of radiation-emitting semiconductor chips having the following steps:
providing a plurality of semiconductor bodies which are suitable for emitting electromagnetic radiation from a radiation exit face;
applying the semiconductor bodies to a carrier;
applying a first mask layer to regions of the carrier between the semiconductor bodies;
applying a conversion layer to the entire surface of the semiconductor bodies and the first mask layer using a spray coating method;
removing the first mask layer, such that in each case a conversion layer arises on the radiation exit faces of the semiconductor bodies; and
applying a reflective layer over the entire surface of the semiconductor bodies, such that a reflective layer is arranged in the beam path of the semiconductor bodies of the subsequent semiconductor chips.

* * * * *